(12) United States Patent
Kato et al.

(10) Patent No.: US 10,559,484 B2
(45) Date of Patent: Feb. 11, 2020

(54) SUBSTRATE STORAGE CONTAINER

(71) Applicant: SHIN-ETSU POLYMER CO., LTD., Tokyo (JP)

(72) Inventors: Katsuhiko Kato, Saitama (JP); Hiroshi Mimura, Saitama (JP); Masaru Hagano, Itoigawa (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 224 days.

(21) Appl. No.: 15/557,720

(22) PCT Filed: Feb. 22, 2016

(86) PCT No.: PCT/JP2016/054974
§ 371 (c)(1),
(2) Date: Sep. 12, 2017

(87) PCT Pub. No.: WO2016/163166
PCT Pub. Date: Oct. 13, 2016

(65) Prior Publication Data
US 2018/0068882 A1    Mar. 8, 2018

(30) Foreign Application Priority Data

Apr. 10, 2015  (JP) ................................ 2015-080588

(51) Int. Cl.
*H01L 21/673* (2006.01)
*H01L 21/683* (2006.01)
*G03F 1/66* (2012.01)

(52) U.S. Cl.
CPC .. *H01L 21/67369* (2013.01); *H01L 21/67359* (2013.01); *H01L 21/67373* (2013.01);
(Continued)

(58) Field of Classification Search
CPC ......... H01L 21/67369; H01L 21/67359; H01L 21/67373; H01L 21/67379;
(Continued)

(56) References Cited

U.S. PATENT DOCUMENTS

| 6,267,245 B1 * | 7/2001 | Bores ................ H01L 21/67369 |
| | | 206/454 |
| 10,242,896 B2 * | 3/2019 | Suzuki .............. H01L 21/67366 |

(Continued)

FOREIGN PATENT DOCUMENTS

JP  2002-305239  * 10/2002 ............. H01L 21/68

OTHER PUBLICATIONS

Machine Translation of JP 2002-305239 provided by EPO accessed Jun. 18, 2019 (Year: 2019).*

*Primary Examiner* — Gideon R Weinerth
(74) *Attorney, Agent, or Firm* — Cowan, Liebowitz & Latman, P.C.; Mark Montague

(57) ABSTRACT

[Problem] To reduce a sliding trace in a vicinity of a substrate end surface, while maintaining smooth vertical movement of a substrate in a groove of the holding section in a substrate storage container, said sliding trace being made with the holding section.
[Solution] The present invention relates to a substrate storage container (1) that is provided with: a container main body (2), which stores a substrate (W), and which has at least one side open; and a removable cover body (3) capable of opening/closing an opening (5) of the container main body (2). In the substrate storage container (1), the inside of the container main body (2) is provided with a first holding section (12) having a first holding groove (12a) for holding a rear portion of the substrate (W), the inner side of the cover body (3) is provided with a second holding section (25) having a second holding groove (25a) for holding a front portion of the substrate (W), and at least the first holding groove (12a) of the first holding section (12) is configured from an alloy resin having a polycarbonate resin and a polybutylene terephthalate resin as main components.

5 Claims, 8 Drawing Sheets

(52) U.S. Cl.
CPC .. *H01L 21/67379* (2013.01); *H01L 21/67383* (2013.01); *G03F 1/66* (2013.01)

(58) Field of Classification Search
CPC ......... H01L 21/67383; H01L 21/67366; G03F 1/66; B65D 2585/86
USPC .......................................... 206/711, 454, 710
See application file for complete search history.

(56) References Cited

U.S. PATENT DOCUMENTS

| | | | | |
|---|---|---|---|---|
| 2003/0025244 | A1* | 2/2003 | Bhatt | G03F 7/70691 264/254 |
| 2003/0221985 | A1* | 12/2003 | Yajima | H01L 21/67369 206/454 |
| 2006/0283774 | A1 | 12/2006 | Hasegawa et al. | |
| 2008/0041761 | A1* | 2/2008 | Nakatogawa | H01L 21/67379 206/711 |
| 2010/0222506 | A1* | 9/2010 | Ohama | H01L 21/67353 524/601 |
| 2011/0064896 | A1* | 3/2011 | Kudo | B29C 45/1657 428/34.1 |
| 2013/0032509 | A1* | 2/2013 | Yamagishi | H01L 21/67379 206/711 |
| 2015/0294882 | A1* | 10/2015 | Matsutori | H01L 21/67369 206/723 |
| 2016/0071753 | A1* | 3/2016 | Hatano | H01L 21/67383 414/222.09 |
| 2016/0204011 | A1* | 7/2016 | Shigeta | H01L 21/67373 206/710 |
| 2017/0236737 | A1* | 8/2017 | Gregerson | H01L 21/67376 206/710 |
| 2017/0294327 | A1* | 10/2017 | Gregerson | H01L 21/67366 |
| 2017/0365496 | A1* | 12/2017 | Mushel | H01L 21/67369 |
| 2018/0068882 | A1* | 3/2018 | Kato | H01L 21/67359 |

\* cited by examiner (6A)

(6B)

(6C)

SUBSTRATE STORAGE CONTAINER

CROSS REFERENCE

This is a U.S. national stage of application No. PCT/JP2016/054974, filed on Feb. 22, 2016, which claims the benefit of priority based on Japanese Patent Application No. 2015-080588 filed on Apr. 10, 2015 in Japan, the content of which is hereby incorporated by reference. The contents described in the patents, the present applications, and the literature cited in the present application are hereby incorporated by reference.

TECHNICAL FIELD

The present invention relates to a substrate storage container for storing substrates, such as semiconductor wafers, photomask glasses, and aluminum disks.

BACKGROUND ART

In recent years, a substrate storage container of a front box open type is manufactured and sold along with an increase in the diameter of substrates represented by semiconductor wafer substrates, photomask glasses, and aluminum disks. The substrate storage container mainly includes: a front-open container body for aligning and storing a plurality of substrates; and a lid removable to open and close an open front surface of the container body. The substrates stored in the substrate storage container are supported one by one by holding portions formed in the container. In general, the container body and the lid are formed from a polycarbonate resin or a polypropylene resin with an excellent rigidity, an excellent visibility of the inside of the container from the outside, and a high cleanliness.

The substrates rotate in the container in some cases due to vibration or impact on the substrate storage container. When the substrates rotate in the container, friction between the substrates and grooves of the holding portions may generate abrasion powder, and this increases the risk of contamination of the substrates. To reduce the risk, holding portions included in a well-known substrate storage container are formed by a material with a frictional resistance smaller than a container body and a lid and with a sliding property more excellent than the container body and the lid. A high wear resistance polycarbonate resin or polybutylene terephthalate resin containing a sliding material is used as the material (for example, see Patent Literature 1). Furthermore, applying a polybutylene terephthalate resin over surfaces of holding portions made of a polycarbonate resin is also proposed (for example, see Patent Literature 2).

CITATION LIST

Patent Literature

Patent Literature 1: Japanese Patent Laid-Open No. 2003-068839
Patent Literature 2: Japanese Patent Laid-Open No. 2006-324327

SUMMARY OF INVENTION

Technical Problem

When the opening of the container body is closed by the lid in the substrate storage container, the substrates inside of the container body slide up the grooves of the holding portions. On the other hand, when the lid is removed from the opening of the container body, the substrates slide down the grooves of the holding portions. Therefore, opening and closing of the lid move the substrates up and down in the grooves of the holding portions. When the holding portions themselves or the surfaces of the holding portions are made of a polybutylene terephthalate resin, the substrates can more smoothly move up and down in the grooves of the holding portions.

However, there is a phenomenon that traces of rubbing against the holding portions are left on and near end surfaces of the substrates due to vibration or the like during transport of the substrate storage container provided with the substrates, and the rubbing traces may reduce the yield during production of semiconductor chips or during production of photomasks. Therefore, an improvement for reducing the rubbing traces near the substrate end surfaces while maintaining smooth up and down movement of the substrates in the grooves of the holding portions is necessary.

The present invention has been made in view of the problem, and an object of the present invention is to reduce traces of rubbing against holding portions near substrate end surfaces while maintaining smooth up and down movement of substrates in grooves of holding portions in a substrate storage container.

Solution to Problem

An embodiment of the present invention for attaining the object provides a substrate storage container including: a container body for storing substrates, wherein at least one side of the container body is open; and a lid removable to open and close an opening of the container body, wherein the substrate storage container includes, in the container body, first holding portions with first holding grooves for holding rear parts of the substrates, the substrate storage container includes, inside of the lid, second holding portions with second holding grooves for holding front parts of the substrates, and at least the first holding grooves in the first holding portions are made of an alloy resin mainly containing a polycarbonate resin and a polybutylene terephthalate resin.

Another embodiment of the present invention provides the substrate storage container, wherein the alloy resin may contain more than 20% by mass and less than 80% by mass of polybutylene terephthalate resin with respect to mass of resin components of the alloy resin.

Another embodiment of the present invention provides the substrate storage container, wherein the alloy resin may contain equal to or more than 25% by mass and equal to or less than 40% by mass of polybutylene terephthalate resin with respect to the mass of the resin components of the alloy resin.

Another embodiment of the present invention provides the substrate storage container, wherein at least the second holding grooves in the second holding portions may be further made of the alloy resin.

Another embodiment of the present invention provides the substrate storage container, wherein the container body may include support portions including shelves for supporting the substrates at certain intervals, on inner surfaces on both left and right sides of the substrates as viewed from the opening, the first holding portions may be provided on a deep side in the support portions as viewed from the opening, the first holding portions may include, inside of the first holding portions, inclined surfaces that can lift up ends of the substrates on the deep side from upper surfaces of the shelves to support the substrates, and when the lid is attached to the opening of the container body, the substrates in the container body may be placed between the first holding grooves and the second holding grooves and may be lifted up from the shelves and held.

Another embodiment of the present invention provides the substrate storage container, wherein the support portions may be bodies different from the container body and may be removably attached to the container body.

Advantageous Effects of Invention

According to the present invention, the traces of rubbing against the holding portions near the substrate end surfaces can be reduced while the smooth up and down movement of the substrates in the grooves of the holding portions in the substrate storage container is maintained.

Figure 1:
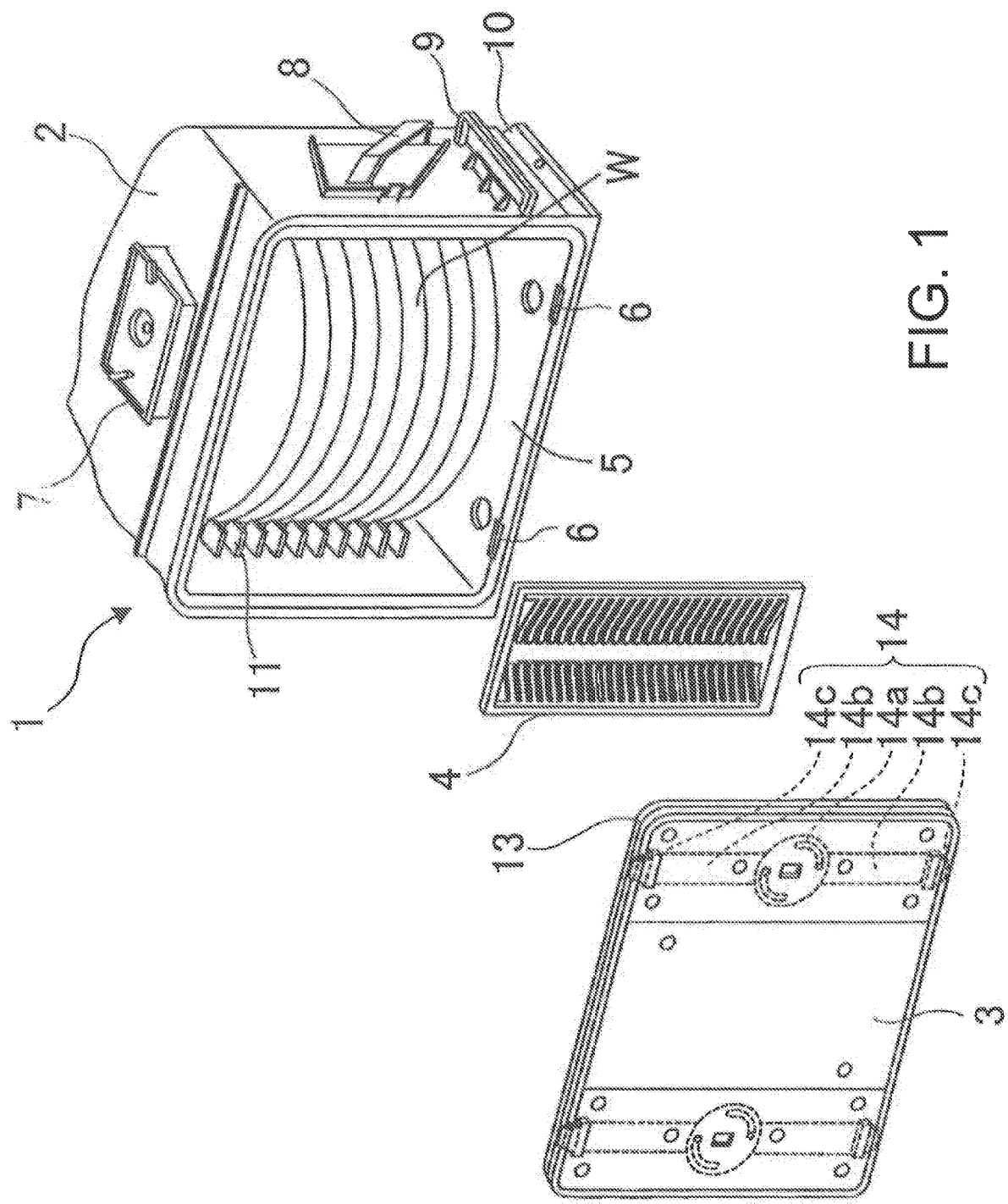
FIG. 1 shows an exploded perspective view of a substrate storage container according to an embodiment of the present invention.

REFERENCE SIGNS LIST 1, 30 substrate storage containers
2, 31 container bodies
3 lid
4 retainer
5 opening
11, 32 support portions
12, 33 teeth (first holding portions)
12a, 33a first holding grooves
20, 34 rear support portions
25 tip portion (second holding portion)
25a second holding groove
W substrate

DESCRIPTION OF EMBODIMENTS

Next, embodiments of a substrate storage container of the present invention will be described with reference to the drawings. The embodiments described below do not limit the present invention, and not all of elements and combinations of the elements described in the embodiments may be essential for the solution of the present invention.

First Embodiment

Figure 2:
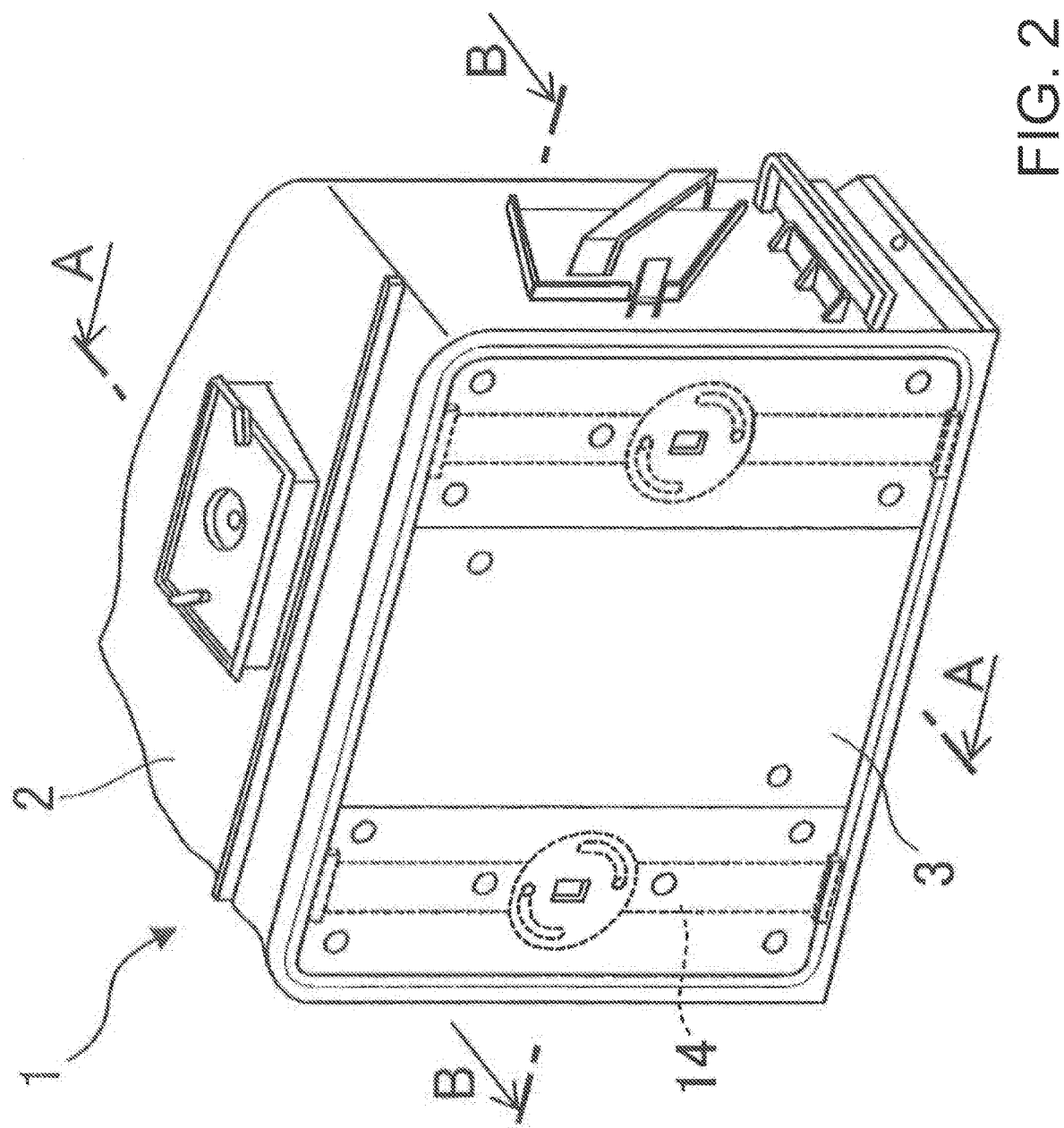
FIG. 2 shows a main perspective view of an assembled state of the substrate storage container of FIG. 1.
Figure 3:
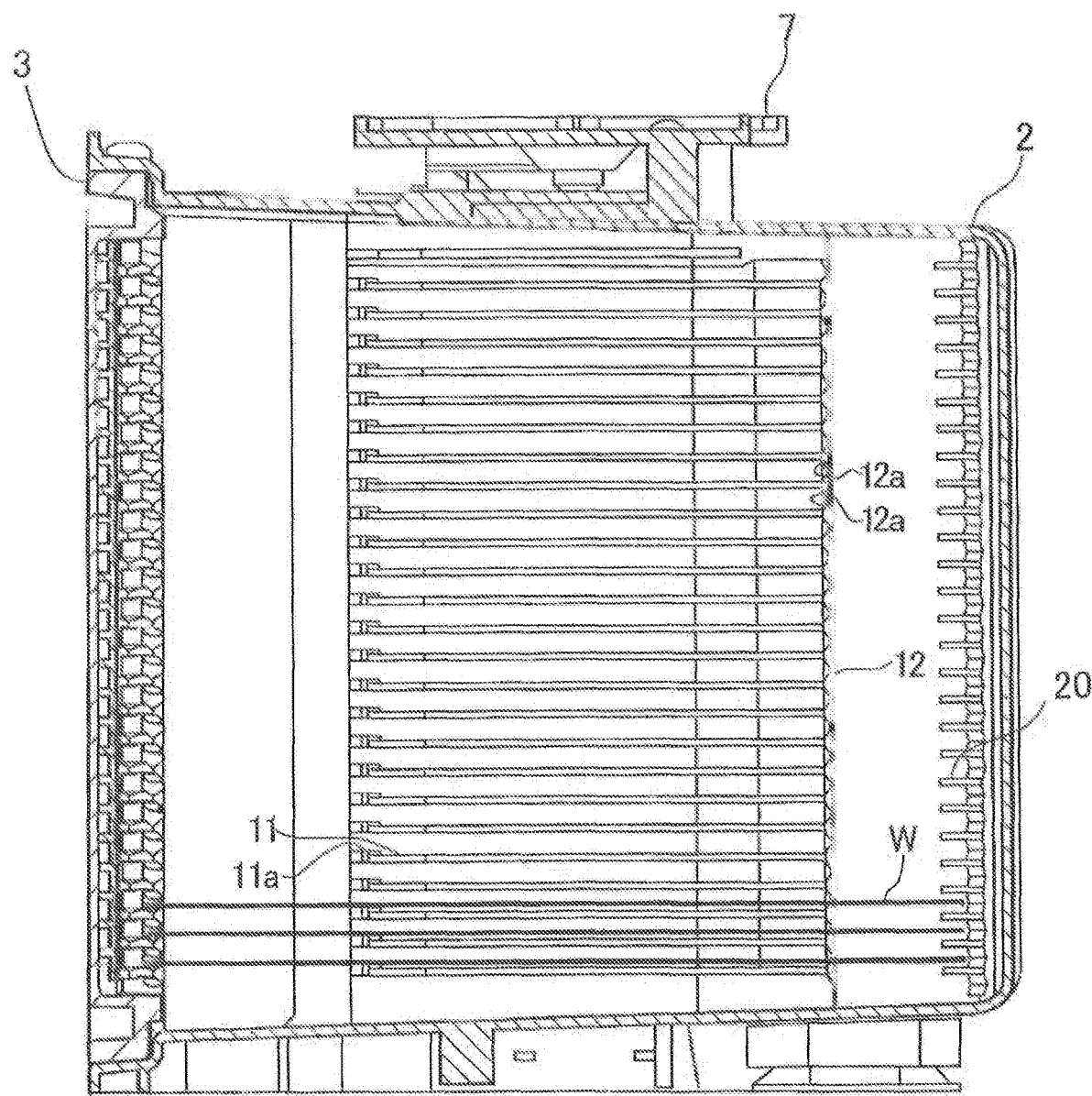
FIG. 3 shows a cross-sectional view of the substrate storage container of FIG. 2 cut in a vertical direction (cross section taken along line A-A).
Figure 4:
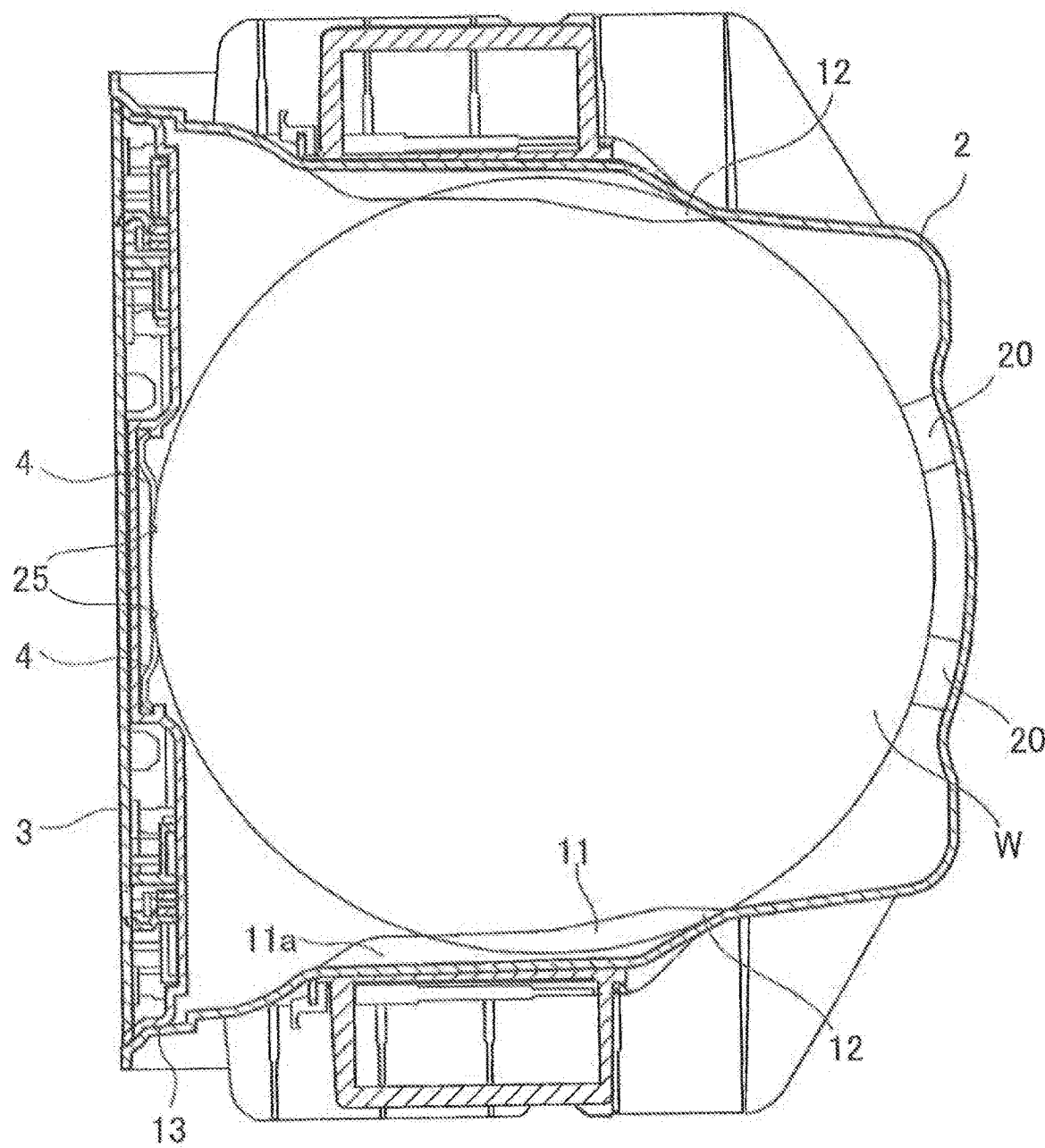
FIG. 4 shows a cross-sectional view of the substrate storage container of FIG. 2 cut in the horizontal direction (cross section taken along line B-B).
Figure 5:
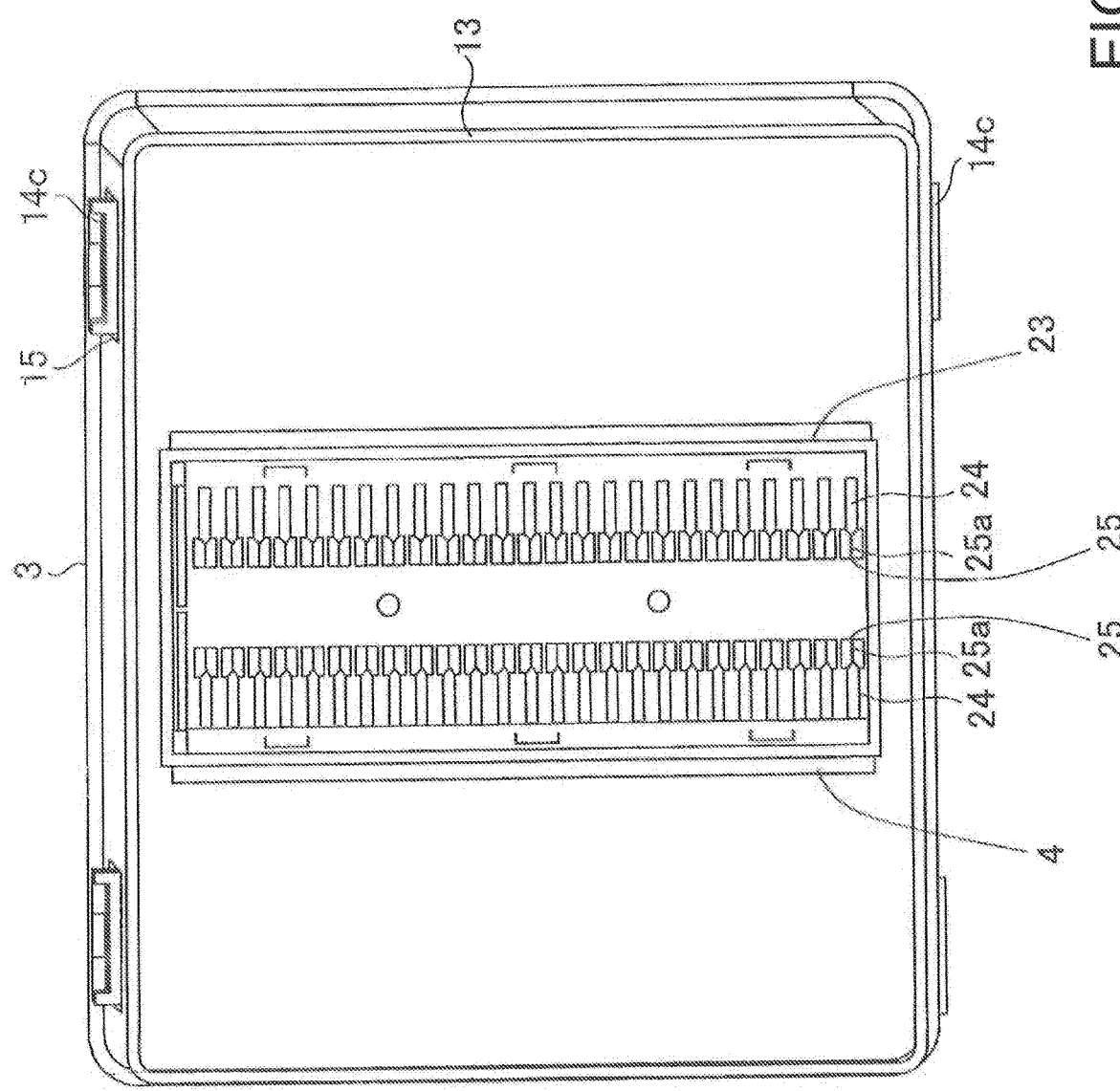
FIG. 5 shows a perspective view of a back surface of a lid of FIG. 1.

FIG. 1 shows an exploded perspective view of the substrate storage container according to a first embodiment of the present invention. FIG. 2 shows a main perspective view of an assembled state of the substrate storage container of FIG. 1. FIG. 3 shows a cross-sectional view of the substrate storage container of FIG. 2 cut in a vertical direction (cross section taken along line A-A). FIG. 4 shows a cross-sectional view of the substrate storage container of FIG. 2 cut in a horizontal direction (cross section taken along line B-B). FIG. 5 shows a perspective view of a back surface of a lid of FIG. 1.

A substrate storage container 1 according to the first embodiment of the present invention includes: a container body 2 storing substrates W, wherein at least one side of the container body is open; and a removable lid 3 allowing to open and close an opening 5 of the container body 2. The container body 2 and the lid 3 are made of a polycarbonate resin in this embodiment. However, the container body 2 and the lid 3 may be made of a resin other than the polycarbonate resin, such as a polypropylene resin. The opening 5 is formed to project and spread from each of a left wall, a right wall, an upper wall, and a lower wall, and the lid 3 can be stored on an inner peripheral edge of the opening 5. The opening 5 includes a pair of locking concave portions 6 for locking the lid 3, on each of upper and lower edges facing each other at the inner peripheral edge of the opening 5. The container body 2 includes, on outer walls, conveyance components such as a robotic flange 7, a manual handle 8, and a side rail 9 for conveying the substrate storage container 1. The container body 2 includes a bottom plate 10 on a bottom surface. The bottom plate 10 is used for positioning, sensing, and the like of the substrate storage container 1.

The container body 2 includes support portions 11 including a plurality of shelves for supporting the substrates W at certain intervals, on inner surfaces on both left and right sides of the substrates W as viewed from the opening 5. Each of the support portions 11 formed in a shelf shape includes, on the side closer to the opening 5, a step 11a for restricting movement of the substrate W in an opening direction. The support portions 11 formed inside of the container body 2 include, on a deep side in a direction opposite the opening 5, teeth 12 as first holding portions for restricting the movement of the substrates W toward the deep side. The teeth 12 include first holding grooves 12a for holding rear parts of the substrates W. Preferably, the first holding groove 12a is formed from two inclined surfaces in a substantially V-shape or U-shape in longitudinal section. The positions of the substrates W supported on the support portions 11 are restricted by lower inclined surfaces of the first holding grooves 12a.

The lid 3 includes a retainer 4 for holding the substrates W, on a surface (back surface) facing the container body 2. The retainer 4 is a component that can come into contact with peripheral edges of the substrates W positioned closer to the opening 5. As shown in FIG. 5, the lid 3 includes a gasket 13 for sealing, on a side wall or the back surface. The lid 3 includes a pair of locking mechanisms 14 inside. The shaft of the locking mechanism 14 is fixed to the lid 3, and the locking mechanism 14 includes: a rotating body 14a that can be rotated and operated from the outside; latch bars 14b that linearly move in an up and down direction in conjunction with the rotating body 14a; and locking claws 14c at tips of the latch bars 14b. The locking claws 14c project from through holes 15 on the side wall of the lid 3 and are locked to the locking concave portions 6 of the container body 2, and the lid 3 can be fixed to the container body 2.

The retainer 4 includes a substantially rectangular frame portion 23 and a plurality of pairs of elastic pieces 24 projecting inside from the frame portion 23. Each of the elastic pieces 24 includes, on an end or middle section, a tip portion 25 as a second holding portion for holding the substrate W. The tip portions 25 are formed to project in a direction facing the substrates W from the elastic pieces 24. Second holding grooves 25a are formed on surfaces of the tip portions 25 on the inner side of the container body 2. Preferably, the second holding groove 25a is formed from two inclined surfaces in a substantially V-shape or U-shape in longitudinal section.

When the lid 3 is attached to the container body 2, the substrates W are held between the second holding grooves 25a and the first holding grooves 12a. The first holding grooves 12a are arranged substantially horizontal to the second holding grooves 25a. It is preferable to form protrusions on substrate support regions of the support portions 11 to reduce a contact area between the substrates W and the support portions 11. The container body 2 includes rear support portions 20 on a rear part deepest from the opening 5. The rear support portions 20 include a plurality of shelves in the vertical direction, and the shelves can be usually not in contact with the substrates W. In this case, each shelf of the rear support portions 20 is formed at a height different from each shelf of the support portions 11. The rear support portions 20 restrict the positions of the substrates W, such as when there is a large impact during transport of the substrate storage container 1. When the substrates W are put inside of the container body 2, the substrates W are supported by lower inclined surfaces of the support portions 11 and the first holding grooves 12a. When the lid 3 is fixed to the container body 2, tips of the substrates W on the opening side come into contact with the lower inclined surfaces of the second holding groves 25a and are gradually pushed to the deep side. As a result, the contact parts of the substrates W and the first holding grooves 12a move upward on the lower inclined surfaces in the first holding grooves 12a. The substrates W are lifted up from the support portions 11 and the rear support portions 20 and held between the deepest parts of the second holding grooves 25a and the deepest parts of the first holding grooves 12a. When the lid 3 is attached and fixed to the container body 2, upper inclined surfaces of the first holding grooves 12a restrict the upward movement of the substrates W from the deepest parts.

As described above, the substrate storage container 1 according to this embodiment includes, in the container body 2, the teeth 12 with the first holding grooves 12a for holding the rear parts of the substrates W and includes, inside of the lid 3, the tip portions 25 with the second holding grooves 25a for holding the front parts of the substrates W. The support portions 11 include shelves for supporting the substrates W at certain intervals, on the inner surfaces on both left and right sides of the substrates W as viewed from the opening 5 of the container body 2. The teeth 12 are provided on the deep side in the support portions 11 as viewed from the opening 5, and the inclined surfaces that can lift up and support the ends of the substrates W on the deep side from the upper surfaces of the shelves are provided inside of the teeth 12. When the lid 3 is attached to the opening 5 of the container body 2, the substrates W in the container body 2 are placed between the first holding grooves 12a and the second holding grooves 25a and are lifted up from the shelves of the support portions 11 and held. The support portions 11 may be integrated with the container body 2 or may be a body different from the container 2 and removably attached to the container body 2.

At least the first holding grooves 12a in the teeth 12 are made of an alloy resin mainly containing a polycarbonate resin and a polybutylene terephthalate resin. Here, the "alloy resin mainly containing a polycarbonate resin and a polybutylene terephthalate resin" is interpreted in a broad sense to include an alloy resin made of only the polycarbonate resin and the polybutylene terephthalate resin as well as alloy resins containing the polycarbonate resin, the polybutylene terephthalate resin, and other resin components. However, the mass of the other resin components is small compared to the mass of the polycarbonate resin or the polybutylene terephthalate resin. An example of a resin suitable for the other resin components includes a polyethylene terephthalate resin.

At least the first holding grooves 12a in the teeth 12 are made of the alloy resin mainly containing the polycarbonate resin and the polybutylene terephthalate resin, and the entire teeth 12 may be made of only the alloy resin. Alternatively, only the parts of the first holding grooves 12a in the teeth 12 may be made of the alloy resin, and the other parts may be made of a resin other than the alloy resin, such as a polycarbonate resin and a polybutylene terephthalate resin. For example, the teeth 12 made of the polycarbonate resin may be prepared, and the surfaces of the first holding grooves 12a may be coated with the alloy resin mainly containing the polycarbonate resin and the polybutylene terephthalate resin. Substantially U-shaped or substantially V-shaped thin curved members made of the alloy resin may be attached to the sections of the first holding grooves 12a of the teeth 12 made of the polycarbonate resin.

The tip portions 25 may not be made of the alloy rein mainly containing the polycarbonate resin and the polybutylene terephthalate resin and may be made of a resin other than the alloy resin, such as a polycarbonate resin and a polybutylene terephthalate resin. On the other hand, the entire retainer 4 or only the second holding grooves 25a may be formed by the alloy resin. The tip portions 25 or the tip portions 25 and the elastic pieces 24 may be formed by the alloy resin. In this case, the alloy resin forming at least the first holding grooves 12a of the teeth 12 and the alloy resin forming at least the second holding grooves 25a of the tip portions 25 may be an alloy resin with the same components or may be alloy resins with different components. In this embodiment, it is preferable to form the entire teeth 12 and the entire retainer 4 by an alloy resin mainly containing a polycarbonate resin and a polybutylene terephthalate resin, regardless of whether the components are the same.

It is more preferable that the alloy resin contain more than 20% by mass and less than 80% by mass of polybutylene terephthalate resin with respect to the mass of the alloy resin. For example, an alloy resin containing 100% by mass of a combination of two types of resins can be suitably used, such as 75% by mass of polycarbonate resin +25% by mass of polybutylene terephthalate resin, 70% by mass of polycarbonate resin +30% by mass of polybutylene terephthalate resin, 60% by mass of polycarbonate resin +40% by mass of polybutylene terephthalate resin, 30% by mass of polycarbonate resin +70% by mass of polybutylene terephthalate resin, and 25% by mass of polycarbonate resin +75% by mass of polybutylene terephthalate resin. It is more preferable that the alloy resin contain equal to or more than 25% by mass and equal to or less than 40% by mass of polybutylene terephthalate resin with respect to the mass of the alloy resin. For example, an alloy resin containing 100% by mass of a combination of two types of resins can be more suitably used, such as 75% by mass of polycarbonate resin +25% by mass of polybutylene terephthalate resin, 70% by mass of polycarbonate resin +30% by mass of polybutylene terephthalate resin, and 60% by mass of polycarbonate resin +40% by mass of polybutylene terephthalate resin.

In addition, an alloy resin containing 100% by mass of a combination of two types of resins can be used, such as 20% by mass of polycarbonate resin +80% by mass of polybutylene terephthalate resin and 80% by mass of polycarbonate resin +20% by mass of polybutylene terephthalate resin.

The rear support portions 20 may be integrated with an internal rear part of the container body 2 or may be removable from the internal rear part. The rear support portions 20 are parts coming into contact with the substrates W and may be made of the alloy resin mainly containing the polycarbonate resin and the polybutylene terephthalate resin, just like at least the first holding grooves 12a of the teeth 12. Preferable mass ratios of the polycarbonate resin and the polybutylene terephthalate resin are the same as when the teeth 12 or the tip portions 25 are made of the alloy resin.

Figure 6:
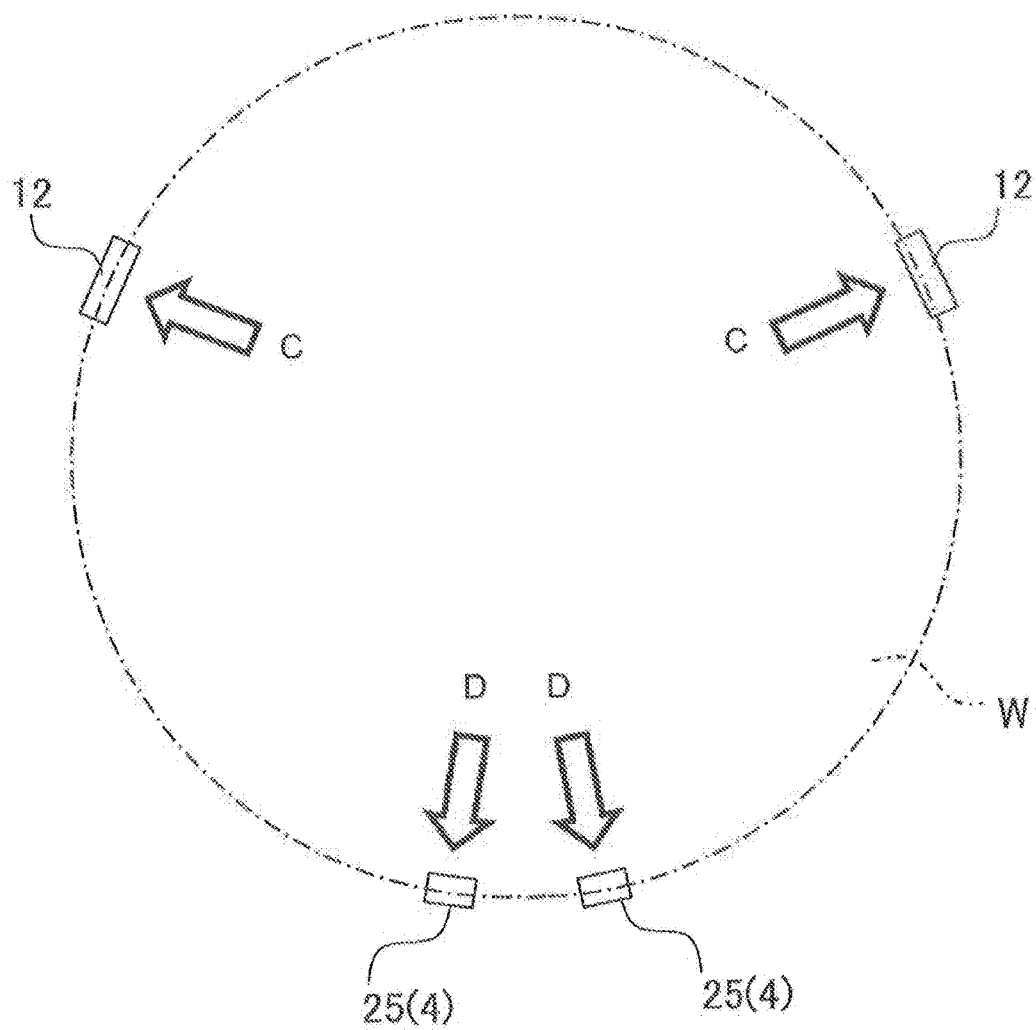
FIG. 6 shows a plan view (6A) of a situation of holding substrates by teeth and a retainer as viewed from above when the substrates are stored in the substrate storage container of FIG. 1, a front view (6B) of the teeth as viewed in a direction of arrows C, and a front view (6C) of tip portions of elastic pieces extended from the retainer as viewed in a direction of arrows D.

FIG. 6 shows a plan view (6A) of a situation of holding the substrates by the teeth and the retainer as viewed from above when the substrates are stored in the substrate storage container of FIG. 1, a front view (6B) of the teeth as viewed in the direction of arrows C, and a front view (6C) of the tip portions of the elastic pieces extended from the retainer as viewed in the direction of arrows D.

Inside of the substrate storage container 1 with the lid 3 closed, the substrate W is placed between the first holding grooves 12a of two teeth 12 and the second holding grooves 25a of the tip portions 25 included in the retainer 4. As shown in FIG. 6 (6B) and FIG. 6 (6C), deepest parts of the first holding grooves 12a and the second holding grooves 25a are formed substantially horizontally as viewed from the arrows C (direction toward the front surfaces of the first holding grooves 12a) and the arrows D (direction toward the front surfaces of the second holding grooves 25a), respectively, in this embodiment. However, the deepest parts may not be formed substantially horizontally and may be inclined from the horizontal line.

Second Embodiment

Next, a substrate storage container according to a second embodiment of the present invention will be described. In the second embodiment, the same reference signs are provided to part or all of the members common to the first embodiment, and the description will not be repeated.

Figure 7:
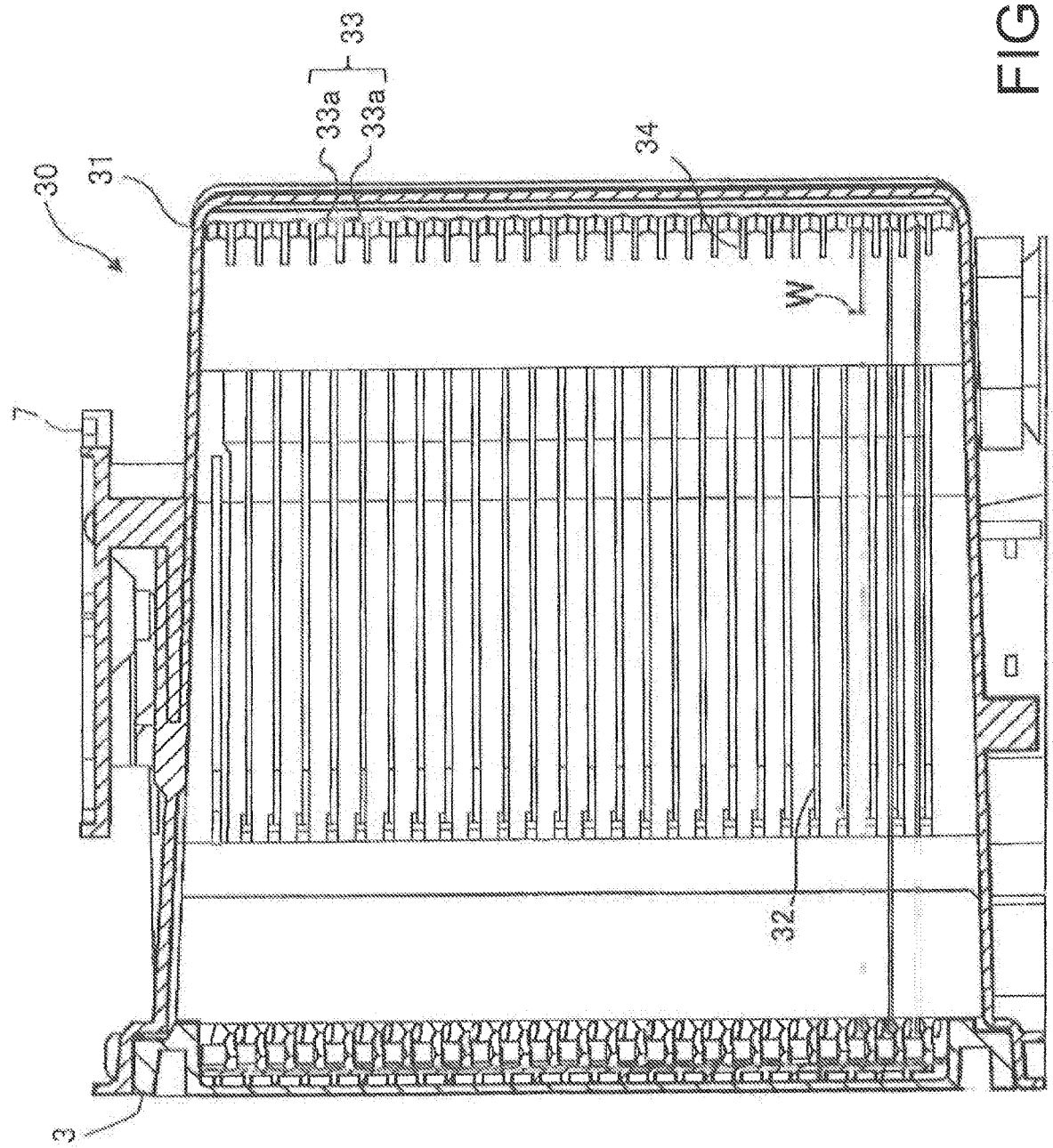
FIG. 7 shows a cross-sectional view of the substrate storage container according to a second embodiment of the present invention in the same view as in FIG. 3.
Figure 8:
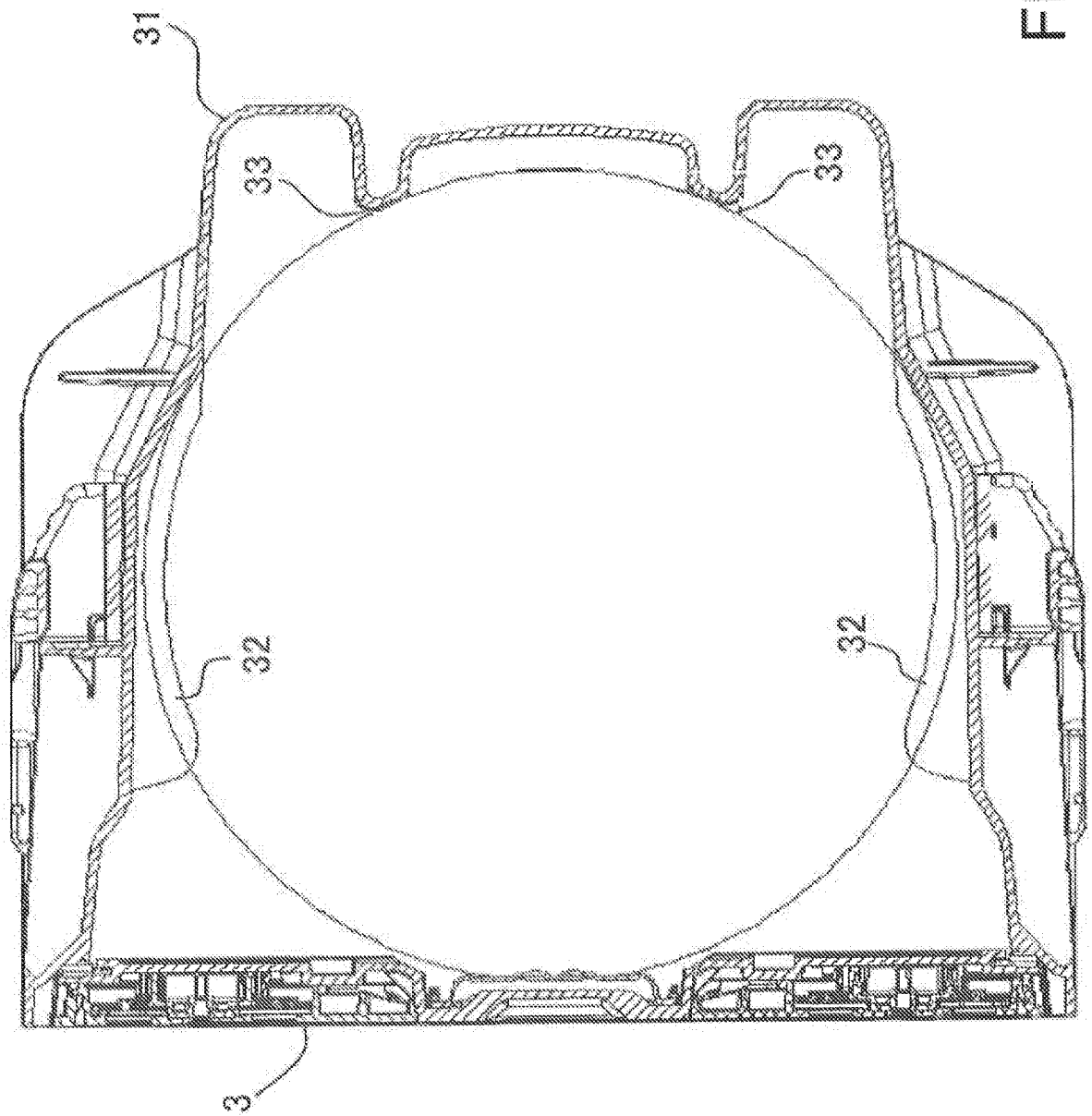
FIG. 8 shows a cross-sectional view of the substrate storage container of FIG. 7 in the same view as in FIG. 4.

FIG. 7 shows a cross-sectional view of the substrate storage container according to the second embodiment of the present invention in the same view as in FIG. 3. FIG. 8 shows a cross-sectional view of the substrate storage container of FIG. 7 in the same view as in FIG. 4.

In a substrate storage container 30 according to the second embodiment, positions holding the rear parts of the substrates W are different from the substrate storage container 1 according to the first embodiment. Hereinafter, parts of the substrate storage container 30 different from the first embodiment will be mainly described.

A container body 31 includes rear support portions 34 for supporting the substrates W at certain intervals, on the inner surface in the deep direction of the substrates W as viewed from the opening 5. The rear support portions 34 are formed in a shelf shape. First holding portions (teeth) 33 are formed between shelves adjacent to each other in the up and down direction. The container body 31 includes support portions 32 in a shelf shape that allows placing the substrates W, on the inner surfaces of both side walls and on substantially middle regions between the opening 5 and the teeth 33. Therefore, the teeth 33 are formed in a direction deeper than the support portions 32 of the substrates W. It is preferable that the teeth 33 be formed at heights such that the retainer 4 formed on the inner surface of the lid 3 and the teeth 33 hold the substrates W when the opening 5 of the container body 31 is closed by the lid 3 and such that the substrates W are separated from the plates of the support portions 32. Therefore, the retainer 4 and the teeth 33 are formed at substantially horizontal positions, and preferably, at positions higher than the support portions 32.

The teeth 33 include first holding grooves 33a for holding the rear parts of the substrates W. Preferably, the first holding groove 33a is formed from two inclined surfaces in a substantially V-shape or U-shape in longitudinal section. Positions of the substrates W supported on the support portions 32 are restricted by lower inclined surfaces of the first holding grooves 33a. When the lid 3 is attached to the container body 31, the stored substrates W supported by the support portions 32 are placed between the teeth 33 and the tip portions 25 as the second holding portions, and the substrates W are lifted up from the support portions 32 and held. Therefore, the substrates W are held between the second holding grooves 25a of the tip portions 25 and the first holding grooves 33a of the teeth 33. When the lid 3 is removed in this state, the substrates W slip down the first holding grooves 33a and are supported again on the support portions 32.

At least the first holding grooves 33a in the teeth 33 are made of an alloy resin mainly containing a polycarbonate resin and a polybutylene terephthalate resin. At least the first holding grooves 33a in the teeth 33 are made of the alloy resin mainly containing the polycarbonate resin and the polybutylene terephthalate resin, and the entire teeth 33 can be made of only the alloy resin. Alternatively, only the parts of the first holding grooves 33a in the teeth 33 may be made of the alloy resin, and the other parts may be made of a resin other than the alloy resin, such as a polycarbonate resin and a polybutylene terephthalate resin. For example, the teeth 33 made of the polycarbonate resin may be prepared, and the surfaces of the first holding grooves 33a may be coated with the alloy resin mainly containing the polycarbonate resin and the polybutylene terephthalate resin. Substantially U-shaped or substantially V-shaped thin curved members made of the alloy resin may be attached to the sections of the first holding grooves 33a of the teeth 33 made of the polycarbonate resin. In this embodiment, the entire teeth 33 and the entire retainer 4 are made of the alloy resin mainly containing the polycarbonate resin and the polybutylene terephthalate resin, regardless of whether the components are the same.

It is more preferable that the alloy resin contain more than 20% by mass and less than 80% by mass of a polybutylene terephthalate resin with respect to the mass of the alloy resin. For example, an alloy resin containing 100% by mass of a combination of two types of resins can be suitably used, such as 75% by mass of polycarbonate resin +25% by mass of polybutylene terephthalate resin, 70% by mass of polycarbonate resin +30% by mass of polybutylene terephthalate resin, 60% by mass of polycarbonate resin +40% by mass of polybutylene terephthalate resin, 30% by mass of polycarbonate resin +70% mass of polybutylene terephthalate resin, and 25% by mass of polycarbonate resin +75% by mass of polybutylene terephthalate resin. It is more preferable that the alloy resin contain equal to or more than 25% by mass and equal to or less than 40% by mass of polybutylene terephthalate resin with respect to the mass of the alloy resin. For example, an alloy resin containing 100% by mass of a combination of two types of resins can be more suitably used, such as 75% by mass of polycarbonate resin +25% by mass of polybutylene terephthalate resin, 70% by mass of polycarbonate resin +30% by mass of polybutylene terephthalate resin, and 60% by mass of polycarbonate resin +40% by mass of polybutylene terephthalate resin. In addition, an alloy resin containing 100% by mass of a combination of two types of resins can be used, such as 20% by mass of polycarbonate resin +80% by mass of polybutylene terephthalate resin and 80% by mass of polycarbonate resin +20% by mass of polybutylene terephthalate resin.

The rear support portions 34 may be integrated with an internal rear part of the container body 31 or may be removable from the internal rear part. The rear support portions 34 are parts coming into contact with the substrates W and may be made of an alloy resin mainly containing a polycarbonate resin and a polybutylene terephthalate resin, just like at least the first holding grooves 33a of the teeth 33. Preferable mass ratios of the polycarbonate resin and the polybutylene terephthalate resin are the same as when the teeth 33 or the tip portions 25 are made of the alloy resin.

Other Embodiments

Although suitable embodiments of the present invention have been described, the present invention is not limited to the embodiments, and the present invention can be modified and carried out in various ways as follows.

Although one side of the container bodies 2 and 31 is open, two directions may be open. The teeth 12 and 33 as the first holding portions and the tip portions 25 as the second holding portion are preferably made of the alloy resin mainly containing the polycarbonate resin and the polybutylene terephthalate resin, including more than 20% by mass and less than 80% by mass of polybutylene terephthalate resin with respect to the mass of the teeth 12 and 33 and the tip portions 25. However, at least one of the teeth 12 and 33 and the tip portions 25 may be made of the alloy resin mainly containing the polycarbonate resin and the polybutylene terephthalate resin, including equal to or less than 20% by mass or equal to or more than 80% by mass of polybutylene terephthalate resin with respect to the mass of the teeth 12 and 33 and the tip portions 25.

Similarly, the teeth 12 and 33 and the tip portions 25 are preferably made of the alloy resin mainly containing the polycarbonate resin and the polybutylene terephthalate resin, including equal to or more than 25% by mass and equal to or less than 40% by mass of polybutylene terephthalate resin with respect to the mass of the teeth 12 and 33 and the tip portions 25. However, at least one of the teeth 12 and 33 and the tip portions 25 may be made of the alloy resin mainly containing the polycarbonate resin and the polybutylene terephthalate resin, including less than 25% by mass or over 40% by mass of polybutylene terephthalate resin with respect to the mass of the teeth 12 and 33 and the tip portions 25.

Although the support portions 11 and 32 and the rear support portions 20 and 34 are made of the polycarbonate resin in the embodiments, the support portions 11 and 32 and the rear support portions 20 and 34 may be made of the alloy resin mainly containing the polycarbonate resin and the polybutylene terephthalate resin, just like the teeth 12 and 33. Therefore, at least the first holding grooves 12a and 33a of the teeth 12 and 33 can be formed from the alloy resin mainly containing the polycarbonate resin and the polybutylene terephthalate resin to form the components (part or entire components) that may come into contact with the substrates W by the alloy resin, such as the entire teeth 12 and 33, the entire first holding grooves 12a and 33a and retainer 4, the entire second holding grooves 25a and teeth 12 and 33, and a combination of arbitrary one of them and at least one of the support portions 11 and 32 and the rear support portions 20 and 34.

Although the substrates W are placed between the first holding grooves 12a and 33a and the second holding grooves 25a and are lifted up from the shelves of the support portions 11 and 32 and held inside of the container bodies 2 and 32 with the lid 3 closed, the substrates W may not be lifted up from the shelves of the support portions 11 and 32 and held. Furthermore, the substrates W in the situation may not be lifted up from the rear support portions 20 and 34 and held. For example, the substrates W may be in contact with at least one of the shelves of the support portions 11 and 32 and the shelves of the rear support portions 20 and 34.

Although an exemplary structure of the retainer 4 is illustrated in the embodiments, the elastic pieces 24 extending from the frame portion 23 are not limited to the cantilever beam structure, and the elastic pieces 24 may have a fixed-fixed beam structure such that the elastic pieces 24 are connected at the center or such that the elastic pieces 24 extending from the left and right frame portions 23 are connected to a center frame provided at the center. The second holding grooves 25a are not limited to the case in which two second holding grooves 25a are formed on the elastic piece 24 of each stage, and only one or three or more second holding grooves 25a may be formed on the elastic piece 24 of each stage. Similarly, the first holding grooves 12a are not limited to the case in which one first holding groove 12a is provided on each of the left and right teeth 12 in the first embodiment, and for example, the first holding groove 12a may be provided on each of the support portions 11 and the rear support portions 20. In the second embodiment, the first holding groove 33a may be provided on each of the support portions 32 and the rear support portions 34.

Furthermore, the components of the embodiments may be combined with each other within a range that allows combining the components. For example, the entire teeth 12 and 33 may be formed by the alloy resin, and the entire retainer 4 may be formed by the polybutylene terephthalate resin.

EXAMPLES

Next, examples of the present invention will be described in comparison with a comparative example. Note that the examples do not limit the present invention.
1. Experimental Method Example 1

The container body and the lid are formed from the polycarbonate resin, and the support portions and the first holding portions (teeth) are formed from the alloy resin containing the polycarbonate resin and the polybutylene terephthalate resin. For the alloy resin, 75% by mass of polycarbonate resin and 25% by mass of polybutylene terephthalate resin are mixed. The retainer including the tip portion as the second holding portion is made of only the polybutylene terephthalate resin. In this way, the substrate storage container including the constituent elements and having the shape shown in FIGS. 1 to 6 is prepared. Twenty five semiconductor wafers are loaded on the substrate storage container, and before a vibration test, whether the semiconductor wafers smoothly slide down from the teeth when the lid is removed from the opening of the container body is investigated. Subsequently, the opening of the container body is closed by the lid, and predetermined packaging is applied. After the packaging, the vibration test is conducted, and the presence/absence and the level of a contact trace of the resin on the semiconductor wafers are checked. For the contact trace, the presence/absence and the level of the contact trace are checked at the ends of the semiconductor wafers on the open side and the deep side before and after the vibration test.

Specifically, the vibration test is conducted based on the following conditions.

Vibration frequency: 5 Hz to 50 Hz to 5 Hz to 50 Hz (one and a half rounds)
Acceleration: ±0.75 G
Vibration time: one way 7 min×3 times
Fixing method: fixed by a band Specifically, the contact trace is checked by the following method.

An edge inspection apparatus of semiconductor wafers is used to observe the end surfaces of the semiconductor wafers on the open side and the deep side before and after the vibration test, from a horizontal direction, an obliquely upward direction, and an obliquely downward direction. As a result, the best evaluation "Double Circle" is provided when the contact trace cannot be seen in the observation from any direction. When there is some contact trace, but the contact trace is in a level with almost no problem, an evaluation "Single Circle" is provided that is the best next to "Double Circle". When a distinct contact trace is observed in the observation from at least one of the directions, evaluation of disqualification "X" is provided.

An evaluation "none" is provided when the semiconductor wafers have not rotated before and after the vibration test, and an evaluation "rotated" is provided when the semiconductor wafers have rotated.

An evaluation "Double Circle" is provided when the semiconductor wafers stored in the container body have smoothly slid down from the first holding grooves of the first holding portions before the vibration test, and an evaluation "X" is provided when the semiconductor wafers have not smoothly slid down.

Example 2

The same material and structure as in Example 1 are adopted to perform the same evaluation as in Example 1 except that the alloy resin used for the teeth in Example 1 is changed to a mixture of 70% by mass of polycarbonate resin and 30% by mass of polybutylene terephthalate resin.

Example 3

The same material and structure as in Example 1 are adopted to perform the same evaluation as in Example 1 except that the alloy resin used for the teeth in Example 1 is changed to a mixture of 60% by mass of polycarbonate resin and 40% by mass of polybutylene terephthalate resin.

Example 4

The same material and structure as in Example 1 are adopted to perform the same evaluation as in Example 1 except that the alloy resin used for the teeth in Example 1 is changed to a mixture of 30% by mass of polycarbonate resin and 70% by mass of polybutylene terephthalate resin.

Example 5

The same material and structure as in Example 1 are adopted to perform the same evaluation as in Example 1 except that the alloy resin used for the teeth in Example 1 is changed to a mixture of 25% by mass of polycarbonate resin and 75% by mass of polybutylene terephthalate resin and that the material used for the retainer is further changed to the alloy resin similar to the teeth (alloy resin with a mixture of 25% by mass of polycarbonate resin and 75% by mass of polybutylene terephthalate resin).

Example 6

The same material and structure as in Example 1 are adopted to perform the same evaluation as in Example 1 except that the alloy resin used for the teeth in Example 1 is changed to a mixture of 30% by mass of polycarbonate resin and 70% by mass of polybutylene terephthalate resin and that the material used for the retainer is further changed to the alloy resin similar to the teeth (30% by mass of polycarbonate resin and 70% by mass of polybutylene terephthalate resin).

Example 7

To manufacture the substrate storage container of FIGS. 7 and 8, the container body including the support portions and the lid are formed from the polycarbonate resin, and the rear support portion and the first holding portions (teeth) are formed from the alloy resin containing the polycarbonate resin and the polybutylene terephthalate resin at positions away from the support portions. The alloy resin is a resin with a mixture of 75% by mass of polycarbonate resin and 25% by mass of polybutylene terephthalate resin. The first holding portions are provided such that the positions are higher than the positions of the support portions. When the lid is attached to the container body, the stored semiconductor wafers supported by the support portions are placed between the first holding portions and the tip portions as the second holding portions and are lifted up from the support portions and held. When the lid is removed, the semiconductor wafers W slide down the first holding grooves 33a and are supported again on the support portions 32. The retainer including the tip portions is formed from the alloy resin with a mixture of 25% by mass of polycarbonate resin and 75% by mass of polybutylene terephthalate resin. Twenty five semiconductor wafers are loaded on the substrate storage container with the configuration (equivalent to the substrate storage container 30 according to the second embodiment), and whether the semiconductor wafers smoothly slide down from the teeth when the lid is removed from the opening of the container body is investigated before the vibration test. Subsequently, the opening of the container body is closed by the lid, and predetermined packaging is applied. After the packaging, the vibration test is conducted, and the presence/absence and the level of the contact trace of the resin on the semiconductor wafers are checked. For the contact trace, the presence/absence and the level of the contact trace are checked at the ends of the semiconductor wafers on the open side and the deep side before and after the vibration test.

Comparative Example 1

The same material and structure as in Example 1 are adopted to perform the same evaluation as in Example 1 except that the alloy resin used for the teeth in Example 1 is changed to a resin with only the polybutylene terephthalate resin.

2. Experimental Results

Table 1 shows comparison of the conditions and evaluation results of the examples and the comparative example. In Table 1, display in fields of the first holding portions and the second holding portions indicates the type and % by mass of each resin component. For example, PC75/PBT25 denotes an alloy resin containing 75% by mass of polycarbonate and 25% by mass of polybutylene terephthalate, and PBT100 denotes 100% by mass of polybutylene terephthalate resin. The other display in the fields of the first holding portions and the second holding portions are interpreted in the same way.

TABLE 1

| | Example1 | Example2 | Example3 | Example4 | Example5 | Example6 | Example7 | Comparative Example1 |
|---|---|---|---|---|---|---|---|---|
| Container Body and Lid | PC | PC | PC | PC | PC | PC | PC | PC |
| First Holding Portion (wt %) | PC75/PBT25 | PC70/PBT30 | PC60/PBT40 | PC30/PBT70 | PC25/PBT75 | PC30/PBT70 | PC75/PBT25 | PBT100 |
| Contact Trace near First Holding Portion | ◎ | ◎ | ◎ | ○ | ○ | ○ | ◎ | X |
| Second Holding Portion (wt %) | PBT100 | PBT100 | PBT100 | PBT100 | PC25/PBT75 | PC30/PBT70 | PC25/PBT75 | PBT100 |
| Contact Trace near Second Holding Portion | ○ | ○ | ○ | ○ | ◎ | ◎ | ◎ | ○ |
| Rotation of Substrate after Vibration Test | None | None | None | None | None | None | None | None |
| Slide-Down Property | ◎ | ◎ | ◎ | ◎ | ◎ | ◎ | ◎ | ◎ |

From Table 1, there is no difference between the examples and the comparative example regarding the rotation of the semiconductor wafers after the vibration test and the slide-down property of the semiconductor wafers after the lid is removed. Although there are differences between four sets of examples, that is, Examples 1 to 3, Example, 7, Example 4, and Examples 5 and 6, regarding the evaluation of the contact trace, all of the examples are in qualified levels. Particularly, when the mixtures of the alloy resin forming the teeth are as in Examples 1 to 3 and Example 7, the evaluations are higher with fewer contact traces than the mixtures in Examples 4 to 6. On the other hand, there is a distinct contact trace on the end surfaces on the deep side of the semiconductor wafers in Comparative Example 1, and Comparative Example 1 is disqualified. As a result, it can be understood that when the teeth are formed only from the polybutylene terephthalate resin, the contact trace of the resin is left at the part.

On the other hand, some contact traces are attached to the end surfaces on the opening side of the semiconductor wafers in Examples 1 to 4, Example 7, and Comparative Example 1 in which the retainer is formed only from the polybutylene terephthalate resin, and the evaluation is lower than Examples 5 and 6 in which the retainer is formed from the alloy resin. However, there is no big obstacle even when the retainer is not formed by the alloy resin, as compared to when the teeth are not made of the alloy resin, and it can be understood that the evaluation is in the qualified level.

INDUSTRIAL APPLICABILITY

The present invention can be used for a substrate storage container for storing substrates, such as semiconductor wafers, photomask glasses, and aluminum disks.

The invention claimed is:

1. A substrate storage container comprising: a container body for storing substrates, wherein at least one side of the container body is open; and a lid removable to open and close an opening of the container body, wherein
    the substrate storage container comprises, in the container body, first holding portions with first holding grooves for holding rear parts of the substrates,
    the substrate storage container comprises, inside of the lid, second holding portions with second holding grooves for holding front parts of the substrates,
    at least the first holding grooves in the first holding portions and at least the second holding grooves in the second holding portions are made of an alloy resin mainly containing a polycarbonate resin and a polybutylene terephthalate resin, and
    the alloy resin making at least the first holding grooves contains an amount equal to or more than 25% by mass and equal to or less than 40% by mass of polybutylene terephthalate resin and equal to or more than 60% and equal to or less than 75% of polycarbonate resin with respect to the mass of the resin components of the alloy resin.

2. The substrate storage container of claim 1, wherein
    the container body comprises support portions including shelves for supporting the substrates at certain intervals, on inner surfaces on both left and right sides of the substrates as viewed from the opening,
    the first holding portions are provided on a deep side in the support portions as viewed from the opening,
    the first holding portions comprise, inside of the first holding portions, inclined surfaces that can lift up ends of the substrates on the deep side from upper surfaces of the shelves to support the substrates, and
    when the lid is attached to the opening of the container body, the substrates in the container body are placed between the first holding grooves and the second holding grooves and are lifted up from the shelves and held.

3. The substrate storage container of claim 2, wherein the support portions are bodies different from the container body and are removably attached to the container body.

4. The substrate storage container of claim 1, wherein the alloy resin making the second holding grooves contains equal to or more than 70% by mass and equal to or less than 75% by mass of polybutylene terephthalate resin with respect to the mass of the resin components of the alloy resin.

5. The substrate storage container of claim 1, wherein the alloy resin making the second holding grooves mainly contains polybutylene terephthalate resin.

* * * * *